US010217841B2

United States Patent
Cheng et al.

(10) Patent No.: US 10,217,841 B2
(45) Date of Patent: Feb. 26, 2019

(54) FORMING AN UNIFORM L-SHAPED INNER SPACER FOR A VERTICAL TRANSPORT FIN FIELD EFFECT TRANSISTOR (VT FINFET)

(71) Applicant: INTERNATIONAL BUSINESS MACHINES CORPORATION, Armonk, NY (US)

(72) Inventors: Kangguo Cheng, Schenectady, NY (US); Juntao Li, Cohoes, NY (US); Peng Xu, Guilderland, NY (US); Jingyun Zhang, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/586,830

(22) Filed: May 4, 2017

(65) Prior Publication Data
US 2018/0323281 A1    Nov. 8, 2018

(51) Int. Cl.
*H01L 29/66* (2006.01)
*H01L 21/8234* (2006.01)
*H01L 27/088* (2006.01)
*H01L 29/06* (2006.01)
*H01L 29/78* (2006.01)

(52) U.S. Cl.
CPC ............... *H01L 29/66553* (2013.01); *H01L 21/823481* (2013.01); *H01L 21/823487* (2013.01); *H01L 27/088* (2013.01); *H01L 29/0653* (2013.01); *H01L 29/7827* (2013.01)

(58) Field of Classification Search
CPC .............. H01L 27/088; H01L 29/0653; H01L 29/66553; H01L 29/7827; H01L 21/823481; H01L 21/823487
See application file for complete search history.

(56) References Cited

U.S. PATENT DOCUMENTS

| 7,417,787 | B2 | 8/2008 | Chopra et al. | |
| 7,655,963 | B2 | 2/2010 | Sadaka et al. | |
| 8,883,649 | B2 | 11/2014 | Yin et al. | |
| 2007/0187717 | A1 | 8/2007 | Sadaka et al. | |
| 2016/0093535 | A1* | 3/2016 | Xu | H01L 21/02244 257/392 |
| 2016/0247678 | A1 | 8/2016 | Feng et al. | |
| 2017/0033106 | A1* | 2/2017 | Walke | H01L 21/823807 |

* cited by examiner

*Primary Examiner* — Andrew Q Tran
(74) *Attorney, Agent, or Firm* — Tutunjian & Bitetto, P.C.; Vazken Alexanian

(57) ABSTRACT

A method of forming a vertical transport fin field effect transistor (VT FinFET), including, forming a plurality of vertical fins on a substrate, forming a sacrificial liner on at least two of the plurality of vertical fins, forming sidewall spacers on the vertical surfaces of the sacrificial liner, wherein the sidewall spacers are on opposite sides of the at least two of the plurality of vertical fins, and removing a portion of the sacrificial liner to form an l-shaped channel adjacent to each of the at least two of the plurality of vertical fins.

14 Claims, 8 Drawing Sheets

FORMING AN UNIFORM L-SHAPED INNER SPACER FOR A VERTICAL TRANSPORT FIN FIELD EFFECT TRANSISTOR (VT FINFET)

BACKGROUND

Technical Field

The present invention generally relates to forming an inner spacer with a uniform thickness across multiple vertical fins, and more particularly to conformally deposition an inner spacer while depositing and etching back an outer spacer to control a bottom spacer thickness for vertical field effect transistors.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin approximately rectangular Si, commonly referred to as the fin with a gate on the fin, as compared to a MOSFET with a single gate parallel to the plane of the substrate. Depending on the doping of the source and drain, an n-FET or a p-FET can be formed.

With ever decreasing device dimensions, forming the individual components and electrical contacts become more difficult. An approach is therefore needed that retains the positive aspects of traditional FET structures, while overcoming the scaling issues created by forming smaller device components.

SUMMARY

In accordance with an embodiment of the present invention, a method of forming a vertical transport fin field effect transistor (VT FinFET) is provided. The method includes forming a plurality of vertical fins on a substrate. The method further includes forming a sacrificial liner on at least two of the plurality of vertical fins. The method further includes forming sidewall spacers on the vertical surfaces of the sacrificial liner, wherein the sidewall spacers are on opposite sides of the at least two of the plurality of vertical fins, and removing a portion of the sacrificial liner to form an L-shaped channel adjacent to each of the at least two of the plurality of vertical fins.

In accordance with another embodiment of the present invention, a method of forming a vertical transport fin field effect transistor (VT FinFET) is provided. The method includes forming a plurality of vertical fins on a substrate. The method further includes forming a sacrificial liner on at least two of the plurality of vertical fins, wherein the sacrificial liner is formed by a conformal deposition. The method further includes forming sidewall spacers on the vertical surfaces of the sacrificial liner, wherein the sidewall spacers are on opposite sides of the at least two of the plurality of vertical fins. The method further includes removing a portion of the sacrificial liner to form an L-shaped channel adjacent to each of the at least two of the plurality of vertical fins, and removing a portion of the inner spacer layer to form L-shaped inner spacers in the L-shaped channels.

In accordance with yet another embodiment of the present invention, a vertical transport fin field effect transistor is provided. The vertical transport fin field effect transistor includes a plurality of vertical fins on a substrate. The vertical transport fin field effect transistor further includes an L-shaped inner spacer adjacent to each of the at least two of the plurality of vertical fins. The vertical transport fin field effect transistor further includes an outer spacer on each of the L-shaped inner spacers, and a gate structure on the outer spacers and the L-shaped inner spacers.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention are related generally to forming an inner spacer with a controlled thickness to compensate for non-uniform bottom spacers from fin pitch walking and to maintain a fixed distance between a gate structure and a bottom source/drain between vertical fins.

Embodiments of the present invention are related generally to using liners to define a space within which an L-shaped inner spacer can be formed.

Exemplary applications/uses to which the present invention can be applied include, but are not limited to: devices using vertical transport fin field effect transistors.

It is to be understood that aspects of the present invention will be described in terms of a given illustrative architecture; however, other architectures, structures, substrate materials and process features and steps can be varied within the scope of aspects of the present invention.

Figure 1:
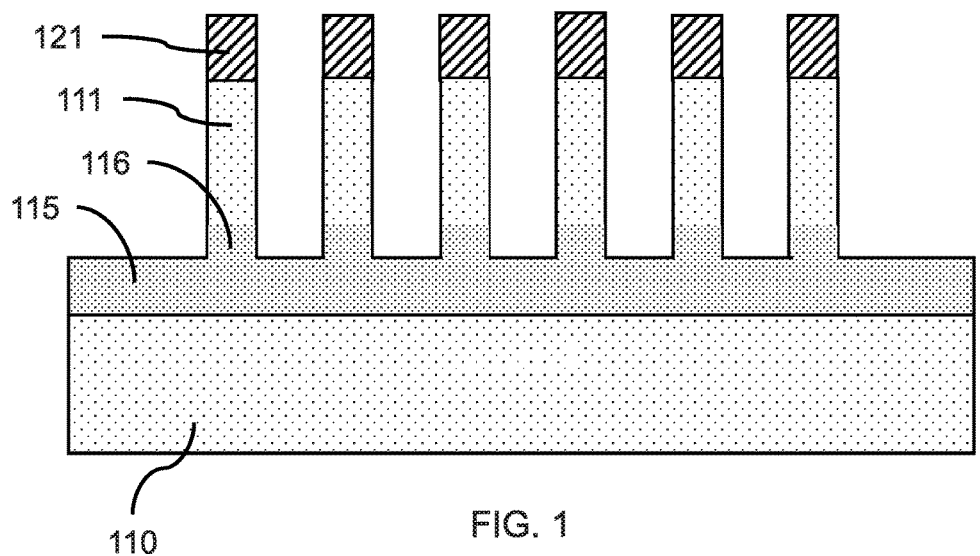
FIG. 1 is a cross-sectional view showing a plurality of vertical fins and fin templates on a bottom source/drain region, in accordance with an embodiment of the present invention.

Referring now to the drawings in which like numerals represent the same or similar elements and initially to FIG. 1, a plurality of vertical fins and fin templates on a substrate is shown, in accordance with an embodiments of the invention.

In various embodiments, a plurality of vertical fins 111 can be formed by a sidewall image transfer (SIT) process, self-aligned double patterning (SADP) process, or self-aligned quadruple patterning (SAQP) process, to provide a tight pitch between vertical fins 111. In various embodiments, a direct print can be used to provide the fin templates 121 from a fin template layer. Immersion Lithography can direct print down to about 78 nm pitch. Extreme ultraviolet lithography (also known as EUV or EUVL), considered a next-generation lithography technology using an extreme ultraviolet (EUV) wavelength, can direct print down to a pitch smaller than 50 nm. Self-aligned double patterning (SADP) can achieve down to about 40 nm to 60 nm fin pitch. Self-aligned quadruple patterning (SAQP) may be used to go down to below 40 nm fin pitch. These other processes are also contemplated, and the scope of the claims and invention should not be limited to the particular illustrated features.

The fin templates 121 can mask the substrate 110 for formation of the vertical fins 111 by directional etching, for example, reactive ion etching (RIE). A bottom source/drain layer 115 can be formed by dopant implantation into the surface of the substrate 110, or epitaxial growth on the substrate surface. The predetermined dopant can be implanted to a predetermined depth to form a bottom source/drain layer 115 with a predetermined thickness. In various embodiments, the bottom source/drain layer 115 can be formed by any suitable doping techniques. An n-type or a p-type bottom source/drain layer 115 can be formed using suitable dopants. The bottom source/drain layer 115 can be heat treated to activate the dopant species, setting the bottom junction, and/or recrystallizing the bottom source/drain layer 115 in the event that part or the entire bottom source/drain layer is damaged/amorphized due to implantation. An extension region 116 of the bottom source/drain can be formed in a lower portion of the vertical fins 111 by dopant diffusion.

In a non-limiting exemplary embodiment, the bottom source/drain layer 115 and extension regions 116 can be n-doped to form an NFET.

Figure 2:
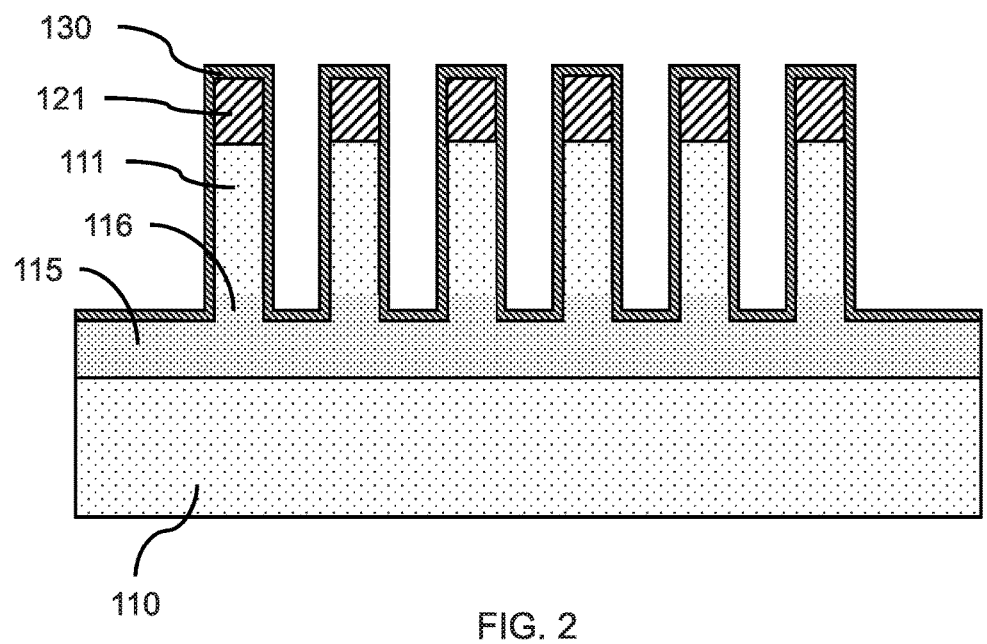
FIG. 2 is a cross-sectional view of a sacrificial liner on the vertical fins and fin templates, in accordance with an embodiment of the present invention.

FIG. 2 is a cross-sectional view of a sacrificial liner on the vertical fins and fin templates, in accordance with an embodiment of the present invention.

In one or more embodiments, a sacrificial liner 130 can be formed on the vertical fins 111, fin templates 121, and bottom source/drain layer 115 by a conformal deposition, for example, atomic layer deposition (ALD) or plasma enhanced atomic layer deposition (PEALD). The sacrificial liner 130 can be a dielectric material that can be selectively removed by a suitable etch. In a non-limiting exemplary embodiment, the sacrificial liner 130 can be silicon borocarbonitride (SiBCN). The sacrificial liner 130 can have a thickness in the range of about 1 nm to about 4 nm.

Figure 3:
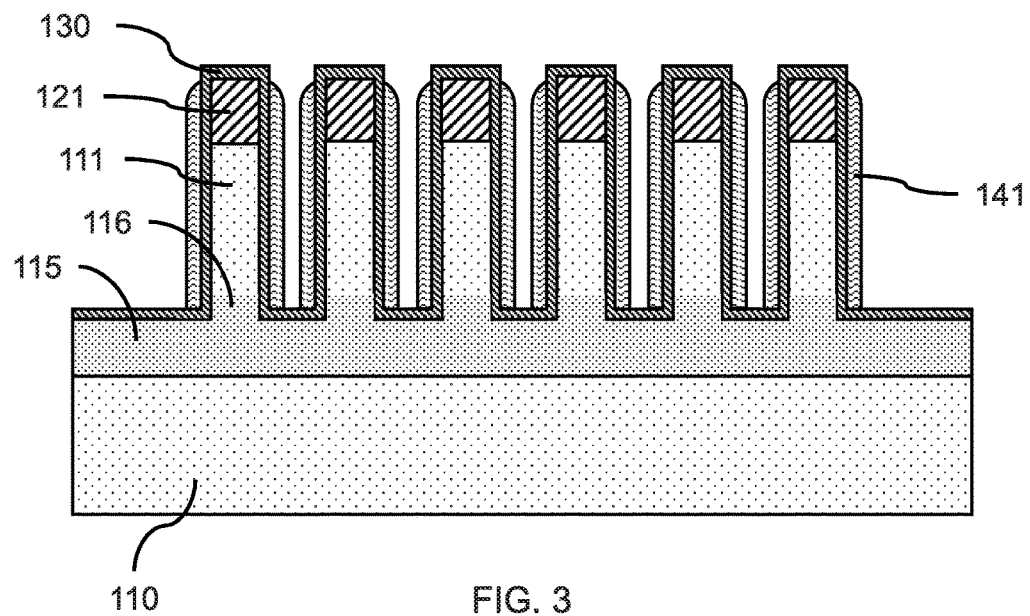
FIG. 3 is a cross-sectional view of a sidewall spacer on the sacrificial liner, in accordance with an embodiment of the present invention.

FIG. 3 is a cross-sectional view of a sidewall spacer on the sacrificial liner, in accordance with an embodiment of the present invention.

In one or more embodiments, a sidewall spacer layer can be formed on the sacrificial liner 130, where the sidewall spacer layer can be conformally deposited to control the thickness. The sidewall spacer layer can be a dielectric material different from the sacrificial liner 130. The sidewall spacer layer can be silicon oxide (SiO). Portions of the sidewall spacer layer can be removed from horizontal surfaces by a directional etch-back process to form sidewall spacers 141 on the vertical surfaces of the sacrificial liner 130. The etch-back of the sidewall spacer layer can expose the sacrificial liner 130 on the tops of the fin templates 121 and the bottom source/drain layer 115. The sidewall spacers 141 can be on opposite sides of the vertical fins 111, where the sidewall spacers 141 are separated from the side wall of the vertical fin by the sacrificial liner 130. The sidewall spacer layer and sidewall spacers 141 can have a thickness in the range of about 5 nm to about 15 nm.

Figure 4:
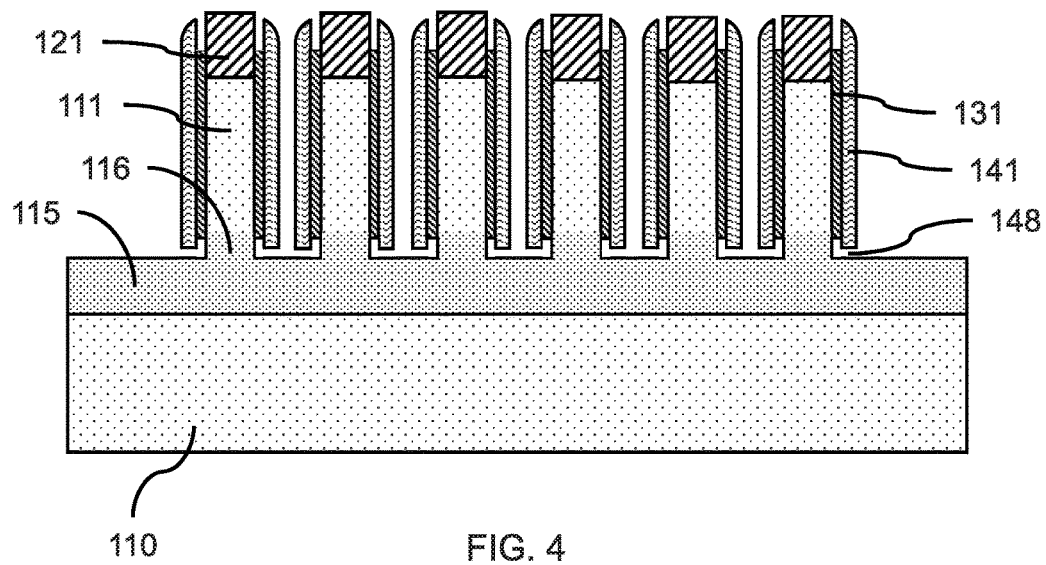
FIG. 4 is a cross-sectional view of the sidewall spacers offset from the vertical fins by the sacrificial liner, in accordance with an embodiment of the present invention.

FIG. 4 is a cross-sectional view of the sidewall spacers offset from the vertical fins by the sacrificial liner, in accordance with an embodiment of the present invention.

In one or more embodiments, portions of the sacrificial liner 130 can be removed by a selective, isotropic etch to form sacrificial liner segments 131 on the side surfaces of the vertical fins 111, while exposing the top and side surfaces of the fin templates and a lower portion of the vertical fins 111. A portion of the sacrificial liner 130 can be removed to expose the top surface and a portion of the sidewalls of the fin templates 121, where removal of the sacrificial liner between the sidewall spacers 141 and fin templates 121 can form a gap. A portion of the sacrificial liner 130 can be removed to expose the extension region 116 at the base of the vertical fin 111, where the height of the sacrificial liner 130 removed from the extension region and vertical fin 111 can be greater than the thickness of the sacrificial liner between the end-face of the sidewall spacers 141 and the substrate surface. Removal of the sacrificial liner 130 between the sidewall spacers 141 and substrate surface 110 can form an L-shaped channel 148, where a leg of the L-shaped channel is along the sidewall of the vertical fin. The L-shaped channel 148 can form an endwall of the sacrificial liner segments 131, where the endwall of the sacrificial liner segments 131 is higher than the end-face of the sidewall spacers 141, such that a portion of the leg of the L-shaped channel 148 is behind the sidewall spacer 141. The sidewall spacers 141 can extend above and below the sacrificial liner segments 131. The leg of the L-shaped channel 148 behind the sidewall spacer can have a height in the range of about 2 nm to about 7 nm along the extension region 116 of the vertical fins 111. The height of the leg can be greater than the thickness of the sacrificial liner 130 to form the L-shape. The sidewall spacers 141 and sacrificial liner segments 131 can shadow a portion of the substrate adjacent to the extension regions 116.

Figure 5:
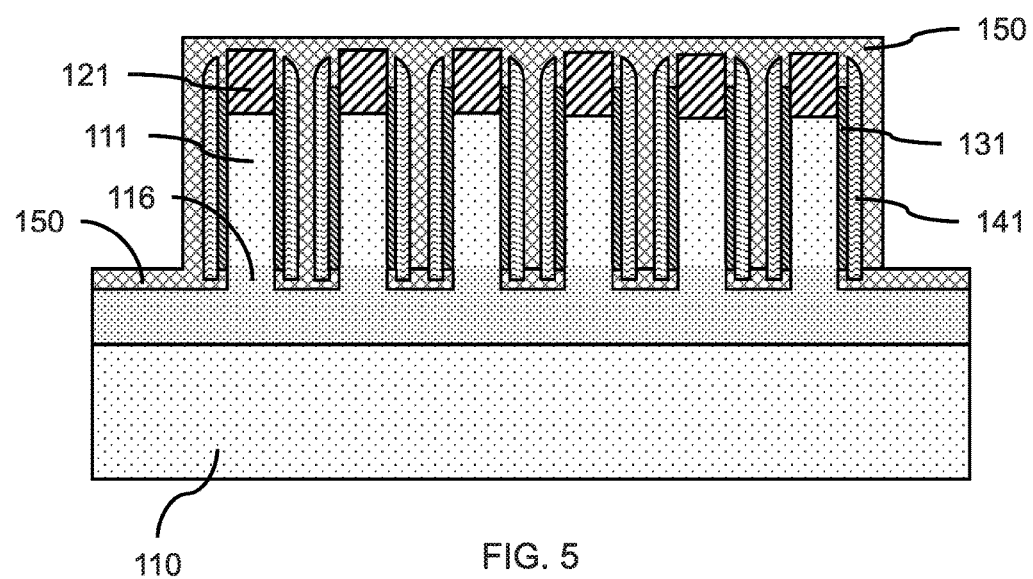
FIG. 5 is a cross-sectional view of an inner spacer layer formed on the substrate, in accordance with an embodiment of the present invention.

FIG. 5 is a cross-sectional view of an inner spacer layer formed on the substrate, in accordance with an embodiment of the present invention.

In one or more embodiments, an inner spacer layer 150 can be formed on the surface of the substrate 110 and in the L-shaped channel 148. The inner spacer layer 150 can be formed by a conformal deposition that deposits a layer in the L-shaped channel 148 and on the exposed surfaces of the sidewall spacers 141, sacrificial liner segments 131, and fin templates 121. The inner spacer layer 150 can be formed in the leg of the L-shaped channel 148 behind the sidewall spacer 141.

Figure 6:
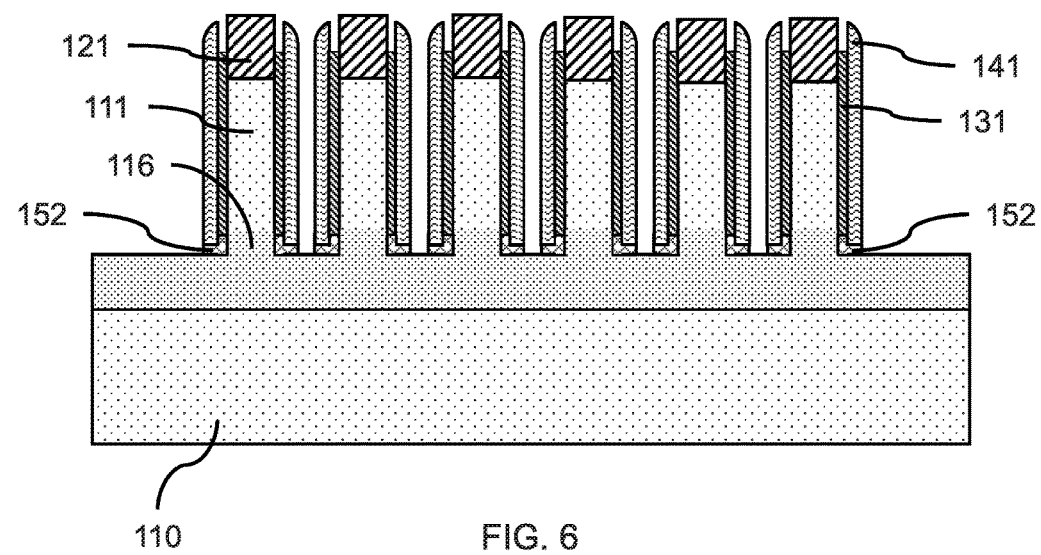
FIG. 6 is a cross-sectional view of inner liners remaining under the sidewall spacer and sacrificial liner, in accordance with an embodiment of the present invention.

FIG. 6 is a cross-sectional view of inner liners remaining under the sidewall spacer and sacrificial liner, in accordance with an embodiment of the present invention.

A directional etch-back can be used to remove the inner spacer layer 150 from exposed horizontal surfaces, while L-shaped inner spacers 152 remain in the L-shaped channels 148, where the inner spacers 152 are on a portion of the vertical fins 111 that can include the extension region 116. The inner spacer layer 150 can be removed from the gaps between the sidewall spacers 141, and from between the sidewall spacers 141 and the fin templates 121, as well as the surface of the substrate 110 and the top surface of the fin templates.

In one or more embodiments, the L-shaped inner spacers 152 can have a length on the substrate surface approximately equal to the combined width of the sidewall spacer 141 and sacrificial liner segment 131 shadowing the substrate 110. The L-shaped inner spacers 152 can surround the base of the vertical fin 111 and cover at least a portion of the extension region 116. The L-shaped inner spacers can have a height in the range of about 2 nm to about 7 nm along the sidewalls of the vertical fins 111.

Figure 7:
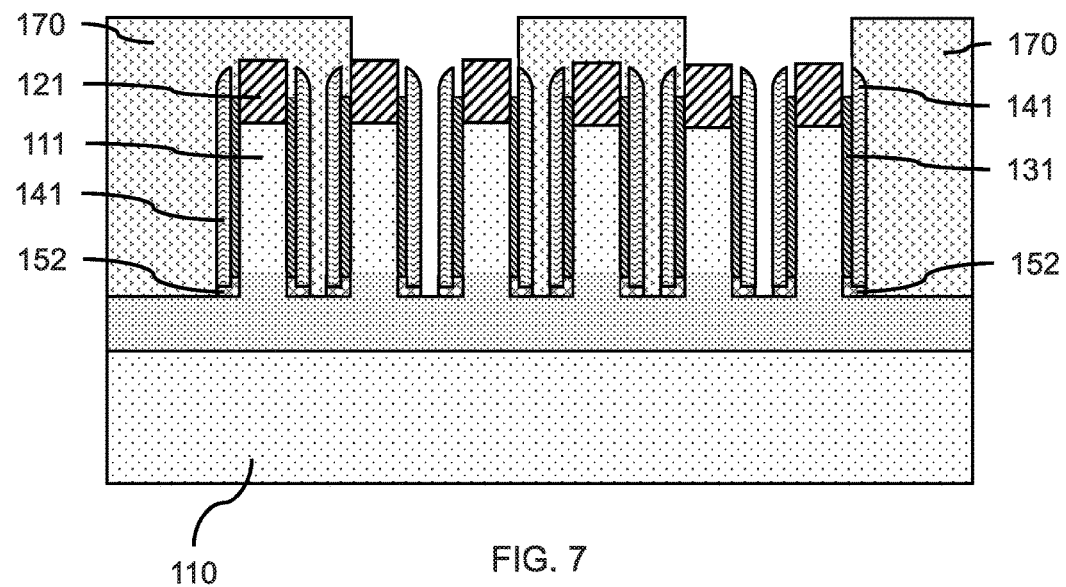
FIG. 7 is a cross-sectional view of a cover layer on a subset of vertical fins and sidewall spacers, in accordance with an embodiment of the present invention.

FIG. 7 is a cross-sectional view of a cover layer on a subset of vertical fins and sidewall spacers, in accordance with an embodiment of the present invention.

In one or more embodiments, a cover layer 170 can be formed on a subset of vertical fins 111 and sidewall spacers 141. The cover layer 170 can be a dielectric layer that can fill in the gaps between the sidewall spacers 141 and between the sidewall spacers 141 and fin templates 121. The cover layer 170 can be blanket deposited and a portion of the cover layer 170 removed to expose predetermined vertical fins 111 and gaps between sidewall spacers 141. A masking layer can be patterned and developed to expose portions of the cover layer 170 for removal, as would be known in the art. The portions of the cover layer 170 can be removed by a directional etch, for example, RIE.

Figure 8:
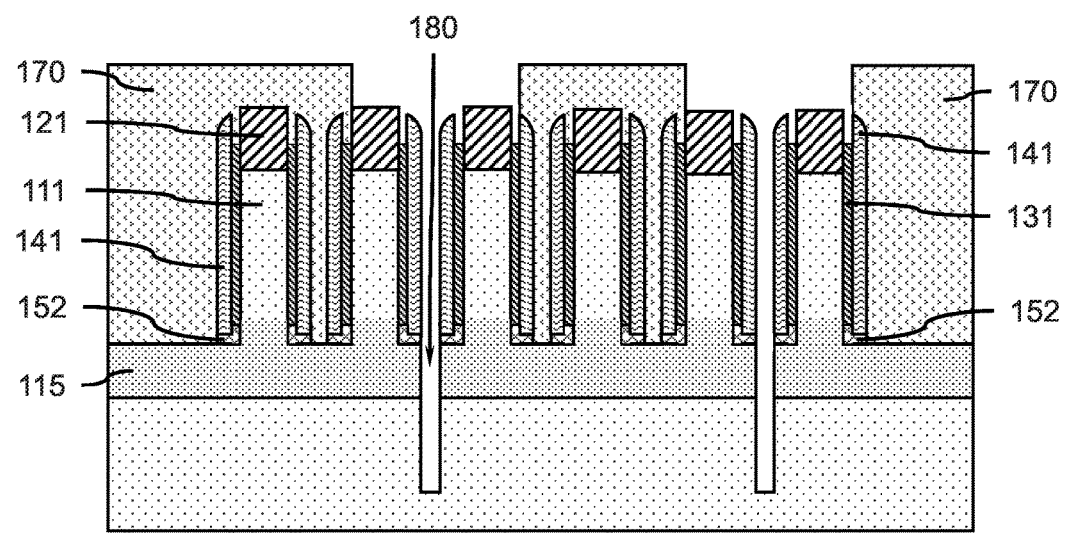
FIG. 8 is a cross-sectional view of isolation region trenches formed in the substrate, in accordance with an embodiment of the present invention.

FIG. 8 is a cross-sectional view of isolation region trenches formed in the substrate, in accordance with an embodiment of the present invention.

In one or more embodiments, portions of the bottom spacer layer 115 and substrate 110 at the bottom of the gaps between sidewall spacers 141 can be removed by selective, directional etching (e.g., RIE) to form isolation region trenches 180. The isolation region trenches 180 can be between predetermined vertical fins 111 intended to form vertical FinFETs. The isolation region trenches 180 can be deeper than the thickness of the bottom source/drain layer 115 to electrically separate adjacent vertical fins to form separate vertical FinFETs.

Figure 9:
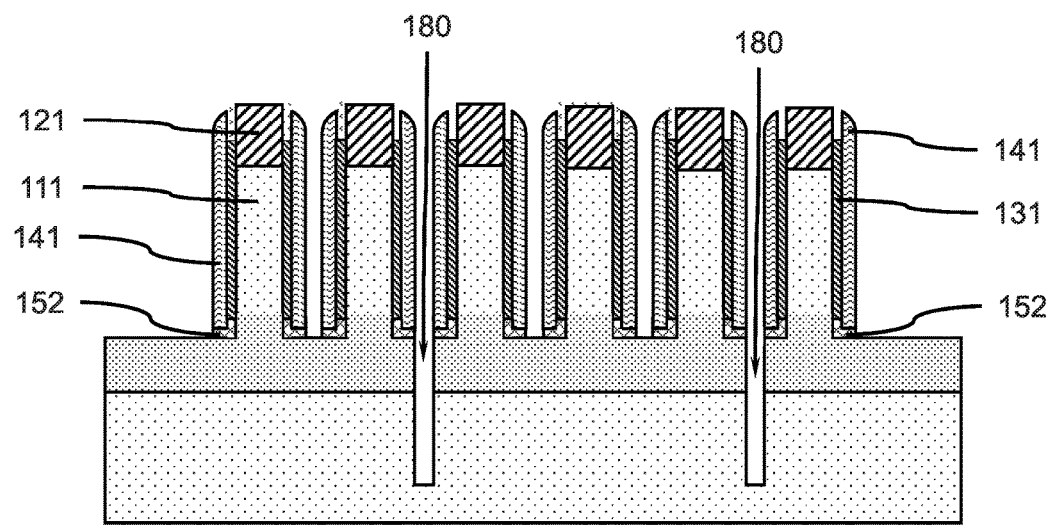
FIG. 9 is a cross-sectional view of exposed sidewall spacers after removal of the cover layer, in accordance with an embodiment of the present invention.

FIG. 9 is a cross-sectional view of exposed sidewall spacers after removal of the cover layer, in accordance with an embodiment of the present invention.

In one or more embodiments, the cover layer 170 can be removed using a selective etch to expose the sidewall spacers 141 and fin templates 121.

Figure 10:
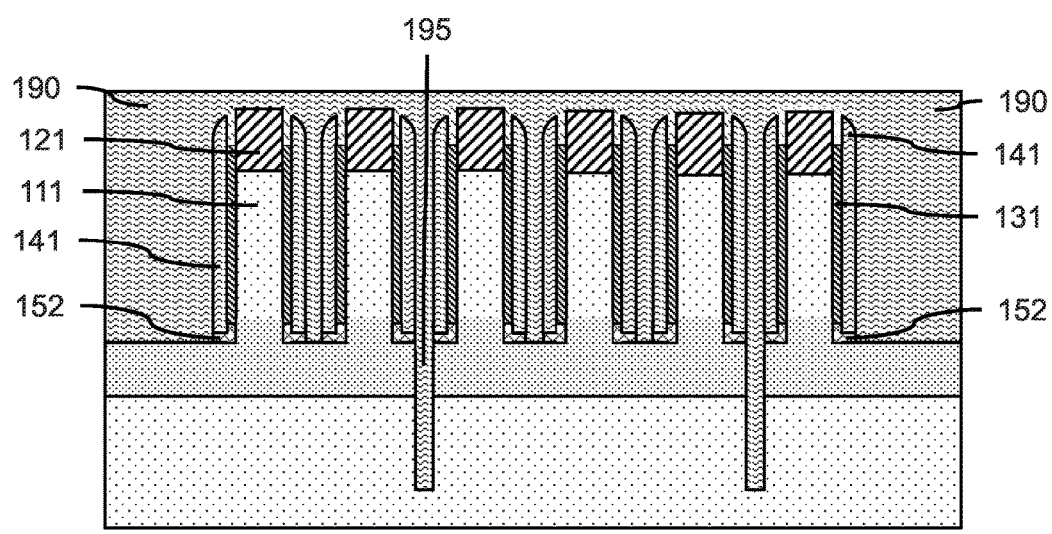
FIG. 10 is a cross-sectional view of a dielectric fill layer on the vertical fins and in the isolation region trenches, in accordance with an embodiment of the present invention.

FIG. 10 is a cross-sectional view of a dielectric fill layer on the vertical fins and in the isolation region trenches, in accordance with an embodiment of the present invention.

In one or more embodiments, a dielectric fill layer 190 can be formed on the vertical fins 111, sidewall spacers 141, and in the isolation region trenches 180. The dielectric fill layer 190 can be an insulating dielectric material that can electrically insulate the vertical FinFETs and form a dielectric isolation region 195 in the isolation region trenches 180. The dielectric fill layer 190 can be the same material as the sidewall spacers 141, so the dielectric fill layer 190 and sidewall spacers 141 can be removed at the same time by the same etching process.

Figure 11:
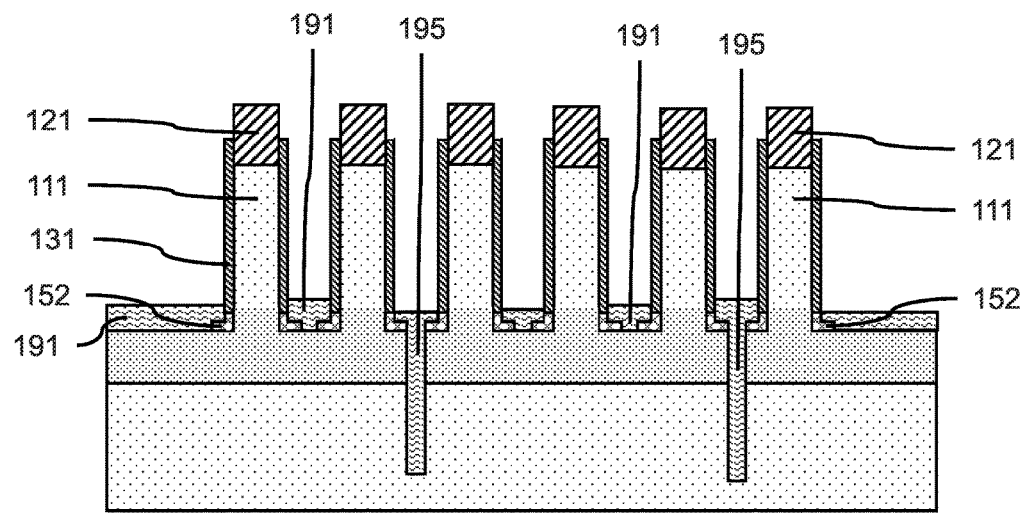
FIG. 11 is a cross-sectional view of outer spacers adjoining the inner spacers, and filled isolation regions, in accordance with an embodiment of the present invention.

FIG. 11 is a cross-sectional view of outer spacers adjoining the inner spacers, and filled isolation regions, in accordance with an embodiment of the present invention.

In one or more embodiments, the sidewall spacers 141 and dielectric fill layer 190 can be at least partially removed by an isotropic and/or directional etch. The sacrificial layer segments 131 can remain coving a portion of the L-shaped inner spacer 152 adjacent to the vertical fin 111.

In one or more embodiments, the height of the dielectric fill layer 190 and sidewall spacers 141 can be reduced by an etch-back process to form outer spacers 191 adjoining the inner spacers 152 and dielectric isolation regions 195. The outer spacers 191 can have differing heights due to pitch walk of the vertical fins 111, where the outer spacers 191 can cover the top surface of the adjoining inner spacer 152. The top surfaces of the outer spacers 191 can be at or above the bottom edge of the sacrificial layer segments 131.

Figure 12:
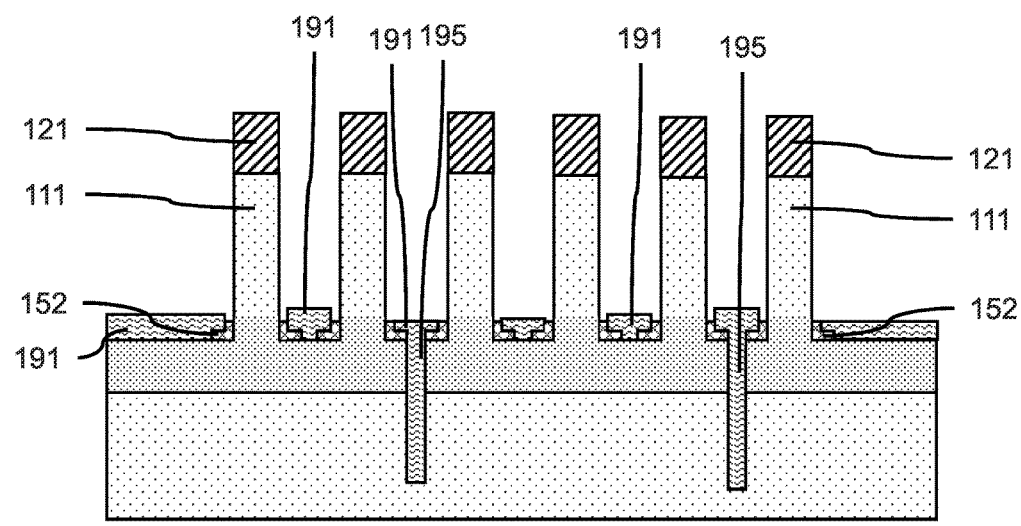
FIG. 12 is a cross-sectional view of vertical fins after removal of the sacrificial liner segments, in accordance with an embodiment of the present invention.

FIG. 12 is a cross-sectional view of vertical fins after removal of the sacrificial liner segments, in accordance with an embodiment of the present invention.

In one or more embodiments, the sacrificial layer segments 131 can be removed to expose a portion of the top surface of the leg of the L-shaped inner spacer 152. The sacrificial layer segments 131 can be removed by a selective isotropic etch. The top surface of the outer spacers 191 can be even with or above the exposed top surface of the L-shaped inner spacer 152. Removal of the sacrificial layer segments 131 can expose the side walls of the vertical fins 111 and the fin templates 121.

Figure 13:
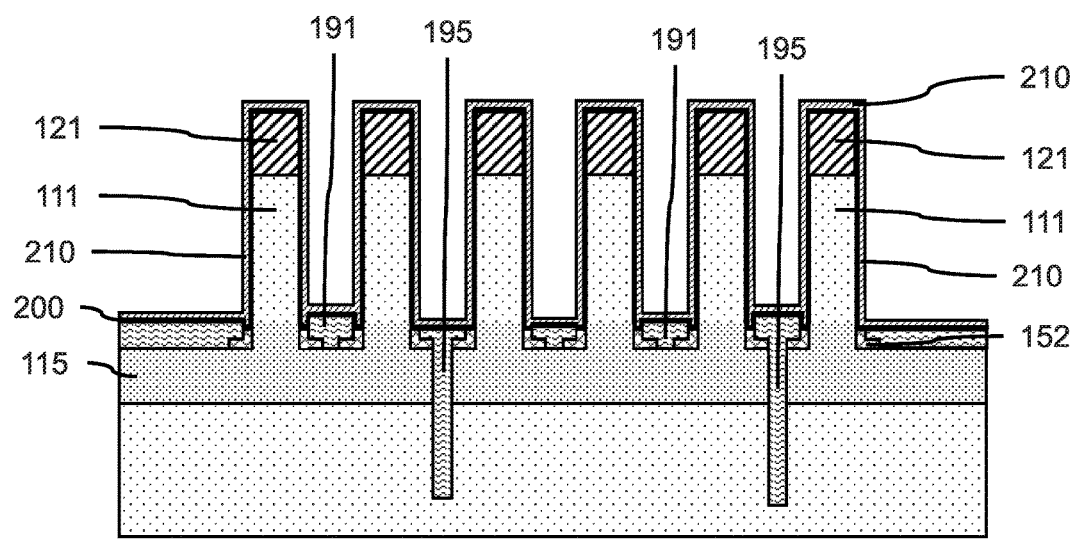
FIG. 13 is a cross-sectional view of a gate dielectric and work function layer on the outer spacers, vertical fins, and fin templates, in accordance with an embodiment of the present invention.

FIG. 13 is a cross-sectional view of a gate dielectric and work function layer on the outer spacers, vertical fins, and fin templates, in accordance with an embodiment of the present invention.

In one or more embodiments, a gate dielectric layer 200 can be formed on the exposed surfaces of the outer spacers 191, inner spacers 152, vertical fins 111, and fin templates 121. The gate dielectric layer 200 can be formed by a conformal deposition to control the gate dielectric thickness. The gate dielectric layer 200 may not fill in the gaps between the outer spacers 191 and the side walls of the vertical fins 111, so a space remains above the vertical leg of the L-shaped inner spacer 152. In various embodiments, the gate dielectric layer 200 can be an insulating dielectric material with a dielectric constant greater than silicon dioxide ($SiO_2$) (i.e., a high-K dielectric material).

In one or more embodiments, a work function layer 210 can be formed on the gate dielectric layer 200, where the work function layer 210 can be a transition metal nitride or transition metal carbide. The work function layer 210 can be formed by a conformal deposition to cover the gate dielectric layer 200 with a uniform thickness. The work function layer can be optional. The work function layer 210 can fill in the space above the top of the vertical leg of the inner spacers 152, and between the outer spacers 191 and the vertical fins 111, wherein the work function layer 210 along the sidewall of the vertical fins 111 can provide a length of a conductive gate electrode defining a gate length on the vertical fins. The height of the vertical leg of the inner spacers 152 can define the distance between the conductive gate electrode and the bottom source/drain layer 115.

Figure 14:
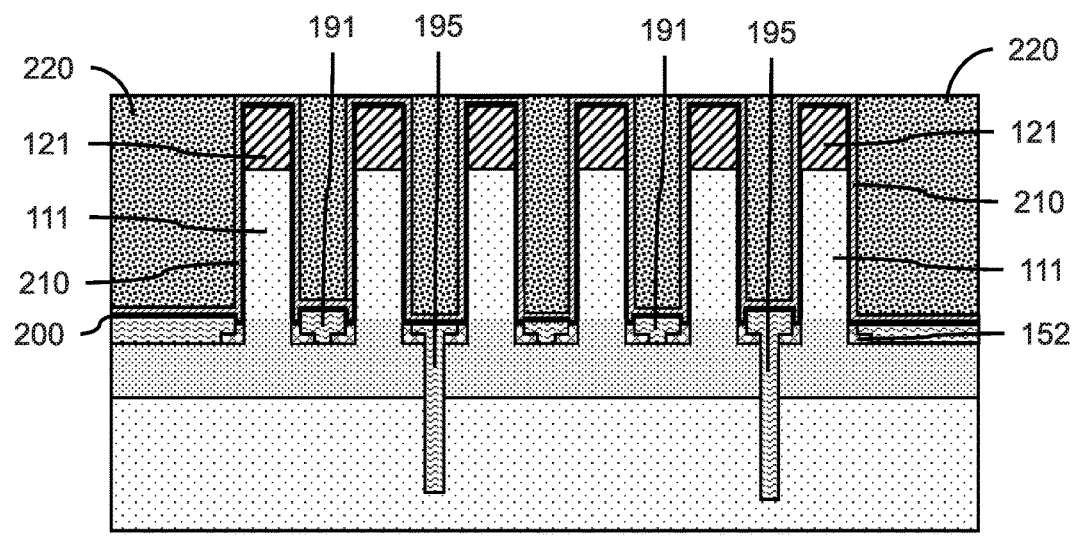
FIG. 14 is a cross-sectional view of a conductive gate fill on the work function layer, in accordance with an embodiment of the present invention.

FIG. 14 is a cross-sectional view of a conductive gate fill on the work function layer, in accordance with an embodiment of the present invention.

In one or more embodiments, a conductive gate fill 220 can be formed on the work function layer 210, where the conductive gate fill 220 can be a conductive metal, conductive metal silicide, conductive carbon material, or combinations thereof. The conductive gate fill 220 and work function layer 210 can form a conductive gate electrode, and the conductive gate fill 220, work function layer 210, and gate dielectric layer 200 can form a gate structure on the vertical fin 111. The vertical fin 111 can provide a conductive channel for a vertical FinFET.

Figure 15:
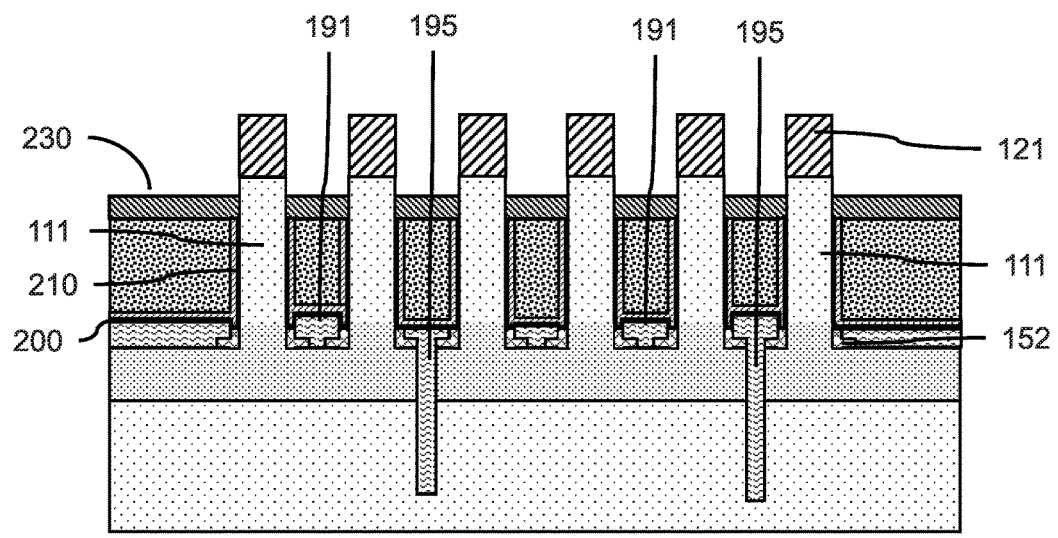
FIG. 15 is a cross-sectional view of a top spacer on the gate structures, in accordance with an embodiment of the present invention.

FIG. 15 is a cross-sectional view of a top spacer on the gate structures, in accordance with an embodiment of the present invention.

In one or more embodiments, the height of the conductive gate fill 220, work function layer 210, and gate dielectric layer 200 can be reduced to define a channel length for the vertical fin 111 between the top surface of the inner spacers 152 and the top of the gate fill layer 220, and to make room for a top spacer layer 230. A top spacer layer 230 can be formed on the gate structure and the vertical fin 111, where the top spacer layer 230 can be an insulating dielectric material to electrically isolate a top source/drain from the conductive gate electrode. The top spacer layer can be blanket deposited and etched back to for a top spacer layer with a predetermined thickness.

Figure 16:
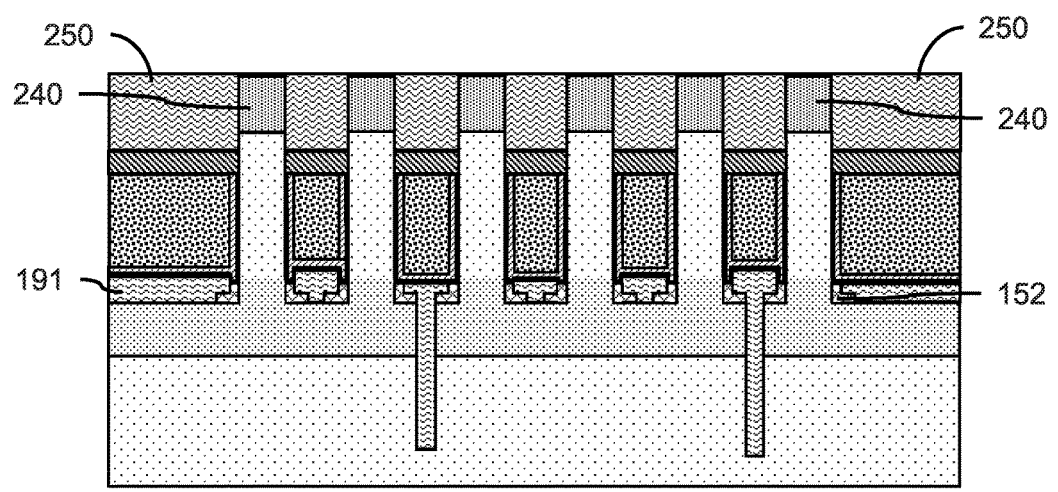
FIG. 16 is a cross-sectional view of an interlayer dielectric layer on the top source/drains and top spacer, in accordance with an embodiment of the present invention.

FIG. 16 is a cross-sectional view of an interlayer dielectric layer on the top source/drains and top spacer, in accordance with an embodiment of the present invention.

In various embodiments, an interlayer dielectric (ILD) layer 250 can be formed on the top spacer layer 230, and a chemical-mechanical polishing used to remove excess ILD material and expose the top surface of the fin templates 121. A selective etch can be used to remove the fin templates 121, and form openings in the ILD layer 250 above the tops of the vertical fins 111. Removal of the fin templates 121 can expose a crystalline surface for epitaxial growth of top source/drains on each of the vertical fins 111.

In one or more embodiments, top source/drains 240 can be formed on each of the exposed vertical fins 111. The top source/drains 240 can be epitaxially grown on single crystal vertical fins 111, where the top source/drains 240 can be formed in the openings in the ILD layer 250.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein s for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation addition to the orientation depicted in the FIGS. For example, if the device in the FIGS. is turned over, elements described as "below" or "beneath" other elements or features would then be oriented "above" the other elements or features. Thus, the term. "below" can encompass both an orientation of above and below. The device can be otherwise orriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

Having described preferred embodiments of a method of forming a uniform inner spacer for a vertical transport fin field effect transistor and a resulting VT FinFET (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a vertical transport fin field effect transistor (VT FinFET), comprising:
   forming a plurality of vertical fins on a substrate;
   forming a sacrificial liner on at least two of the plurality of vertical fins;
   forming sidewall spacers on the vertical surfaces of the sacrificial liner, wherein the sidewall spacers are on opposite sides of the at least two of the plurality of vertical fins; and
   removing a portion of the sacrificial liner to form an L-shaped channel adjacent to each of the at least two of the plurality of vertical fins.

2. The method of claim 1, further comprising:
   forming an inner spacer layer on the surface of the substrate, wherein the inner spacer layer fills the L-shaped channel adjacent to each of the at least two of the plurality of vertical fins.

3. The method of claim 2, further comprising:
   removing a portion of the inner spacer layer to form L-shaped inner spacers in the L-shaped channels.

4. The method of claim 3, wherein the L-shaped inner spacers have a height in the range of about 2 nm to about 7 nm along the at least two of the plurality of vertical fins.

5. The method of claim 1, further comprising:
   forming a bottom source/drain layer at a surface of a substrate, wherein the plurality of vertical fins are on the bottom source/drain layer.

6. The method of claim 1, wherein the sidewall spacers have a thickness in the range of about 5 nm to about 15 nm.

7. The method of claim 1, wherein the sacrificial liner has a thickness in the range of about 1 nm to about 4 nm.

8. The method of claim 1, further comprising:
   forming a dielectric fill layer on the substrate and vertical fins, and etching back the dielectric fill layer and sidewall spacers to form outer spacers on the L-shaped inner spacers.

9. The method of claim 1, wherein the sacrificial liner is silicon borocarbonitride (SiBCN).

10. A method of forming a vertical transport fin field effect transistor (VT FinFET), comprising:
    forming a plurality of vertical fins on a substrate;
    forming a sacrificial liner on at least two of the plurality of vertical fins, wherein the sacrificial liner is formed by a conformal deposition;
    forming sidewall spacers on the vertical surfaces of the sacrificial liner, wherein the sidewall spacers are on opposite sides of the at least two of the plurality of vertical fins;
    removing a portion of the sacrificial liner to form an L-shaped channel adjacent to each of the at least two of the plurality of vertical fins; and
    removing a portion of an inner spacer layer to form L-shaped inner spacers in the L-shaped channels.

11. The method of claim 10, wherein the sacrificial liner is silicon borocarbonitride (SiBCN).

12. The method of claim 11, wherein the sacrificial liner has a thickness in the range of about 1 nm to about 4 nm.

13. The method of claim 12, wherein the sidewall spacers are silicon oxide (SiO).

14. The method of claim 12, wherein the sidewall spacers have a thickness in the range of about 5 nm to about 15 nm.

* * * * *